United States Patent
Xu et al.

(10) Patent No.: US 11,545,540 B2
(45) Date of Patent: Jan. 3, 2023

(54) ARRAY SUBSTRATE, DISPLAY APPARATUS, METHOD OF REDUCING CURRENT-RESISTANCE DROP AND DATA LOSS IN DISPLAY APPARATUS, AND METHOD OF FABRICATING ARRAY SUBSTRATE

(71) Applicant: BOE Technology Group Co., Ltd., Beijing (CN)

(72) Inventors: Pan Xu, Beijing (CN); Xiaoyun Liu, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 756 days.

(21) Appl. No.: 16/344,013

(22) PCT Filed: Apr. 2, 2018

(86) PCT No.: PCT/CN2018/081543
§ 371 (c)(1),
(2) Date: Apr. 22, 2019

(87) PCT Pub. No.: WO2019/191862
PCT Pub. Date: Oct. 10, 2019

(65) Prior Publication Data
US 2021/0367026 A1    Nov. 25, 2021

(51) Int. Cl.
*H01L 29/08* (2006.01)
*H01L 27/32* (2006.01)
*H01L 51/56* (2006.01)

(52) U.S. Cl.
CPC ...... *H01L 27/3279* (2013.01); *H01L 27/3272* (2013.01); *H01L 51/56* (2013.01); *H01L 2227/323* (2013.01)

(58) Field of Classification Search
CPC ... H01L 27/32; H01L 27/323; H01L 27/3272; H01L 27/3262; H01L 27/3279;
(Continued)

(56) References Cited

U.S. PATENT DOCUMENTS

2007/0296333 A1    12/2007  Kim et al.
2011/0062458 A1     3/2011  Shimoda et al.
(Continued)

FOREIGN PATENT DOCUMENTS

CN    101093851 A    12/2007
CN    102024843 A     4/2011
(Continued)

OTHER PUBLICATIONS

Extended European Search Report in the European Patent Application No. 18867305.7, dated Oct. 20, 2021.
(Continued)

*Primary Examiner* — Chuong A Luu
(74) *Attorney, Agent, or Firm* — Intellectual Valley Law, P.C.

(57) ABSTRACT

The present application provides an array substrate. The array substrate includes a base substrate; a plurality of light emitting elements on the base substrate; a plurality of driving thin film transistors for driving light emission of the plurality of light emitting elements, each of the plurality of driving thin film transistors including a first active layer; one or more power supply lines configured to supply a driving current respectively to the plurality of light emitting elements; and a light shielding layer configured to shield light from irradiating on the first active layer, the light shielding layer being electrically connected to at least one of the one or more power supply lines.

18 Claims, 8 Drawing Sheets

(58) Field of Classification Search
CPC ... H01L 27/02; H01L 27/0248; H01L 27/322; H01L 27/3276; H01L 27/3223; H01L 27/14; H01L 51/52; H01L 51/56; H01L 51/50; H01L 51/5221; H01L 51/5044
USPC .......................................................... 257/40
See application file for complete search history.

(56) References Cited

U.S. PATENT DOCUMENTS

| | | | |
|---|---|---|---|
| 2016/0071888 A1 | 3/2016 | Park et al. | |
| 2017/0025488 A1* | 1/2017 | Li | H01L 27/326 |
| 2017/0075211 A1* | 3/2017 | Hayashi | G03F 1/24 |
| 2017/0345846 A1* | 11/2017 | Yang | H01L 27/3272 |
| 2018/0061908 A1 | 3/2018 | Shim et al. | |
| 2019/0067403 A1 | 2/2019 | Song et al. | |
| 2019/0074383 A1 | 3/2019 | Yu et al. | |
| 2019/0288056 A1 | 9/2019 | Xiao et al. | |
| 2020/0091266 A1 | 3/2020 | Cho | |

FOREIGN PATENT DOCUMENTS

| | | |
|---|---|---|
| CN | 105789244 A | 7/2016 |
| CN | 106997896 A | 8/2017 |
| CN | 107093618 A | 8/2017 |
| CN | 107452809 A | 12/2017 |
| CN | 107527940 A | 12/2017 |
| CN | 107799556 A | 3/2018 |

OTHER PUBLICATIONS

International Search Report & Written Opinion dated Dec. 28, 2018, regarding PCT/CN2018/081543.
Second Office Action in the Chinese Patent Application No. 201880000247.X, dated Feb. 23, 2022; English translation attached.

* cited by examiner

PL-b

ARRAY SUBSTRATE, DISPLAY APPARATUS, METHOD OF REDUCING CURRENT-RESISTANCE DROP AND DATA LOSS IN DISPLAY APPARATUS, AND METHOD OF FABRICATING ARRAY SUBSTRATE

CROSS-REFERENCE TO RELATED APPLICATION

This application is a national stage application under 35 U.S.C. § 371 of International Application No. PCT/CN2018/081543, filed Apr. 2, 2018, the contents of which are incorporated by reference in the entirety.

TECHNICAL FIELD

The present invention relates to display technology, more particularly, to an array substrate, a display apparatus, a method of reducing current-resistance (IR) drop in one or more power supply lines and reducing data loss in a display apparatus, and a method of fabricating an array substrate.

BACKGROUND

Metal oxide or metal oxynitride thin film transistors have many advantages such as a higher carrier density and higher mobility. For example, the metal oxide or metal oxynitride thin film transistors can be made smaller, and the display panel made of such thin film transistors can achieve a higher resolution and a better display effect. Moreover, the metal oxide or metal oxynitride thin film transistors have the advantages of lower manufacturing costs, higher transmittance, and higher bad gap. The metal oxide or metal oxynitride thin film transistors have found a wide range of applications in display field. However, oxide and oxynitride thin film transistors are sensitive to light irradiation, resulting in threshold voltage drift.

SUMMARY

In one aspect, the present invention provides an array substrate comprising a base substrate; a plurality of light emitting elements on the base substrate; a plurality of driving thin film transistors for driving light emission of the plurality of light emitting elements, each of the plurality of driving thin film transistors comprising a first active layer; one or more power supply lines configured to supply a driving current respectively to the plurality of light emitting elements; and a light shielding layer configured to shield light from irradiating on the first active layer, the light shielding layer being electrically connected to at least one of the one or more power supply lines.

Optionally, an orthographic projection of the light shielding layer on the base substrate at least partially overlaps with an orthographic projection of the first active layer on the base substrate.

Optionally, the orthographic projection of the light shielding layer on the base substrate substantially covers the orthographic projection of the first active layer on the base substrate.

Optionally, each of the plurality of driving thin film transistors further comprises a first gate electrode between the first active layer and the light shielding layer.

Optionally, an orthographic projection of the light shielding layer on the base substrate at least partially extends outside an orthographic projection of the first gate electrode on the base substrate.

Optionally, an orthographic projection of the light shielding layer on the base substrate substantially covers an orthographic projection of the first gate electrode on the base substrate.

Optionally, an orthographic projection of the light shielding layer on the base substrate substantially surrounds, but is substantially non-overlapping with, an orthographic projection of the first gate electrode on the base substrate.

Optionally, the first gate electrode and the one or more power supply lines are in a same layer and comprise a same material.

Optionally, each of the plurality of driving thin film transistors comprises a source electrode electrically connected to one of the one or more power supply lines.

Optionally, the light shielding layer is electrically connected to the at least one of the one or more power supply lines through the source electrode.

Optionally, the array substrate further comprises a plurality of switching thin film transistors configured to respectively control on/off switching of the plurality of driving thin film transistors, each of the plurality of switching thin film transistors comprising a second active layer; wherein an orthographic projection of the light shielding layer on the base substrate is substantially non-overlapping with an orthographic projection of the second active layer on the base substrate.

Optionally, each of the plurality of switching thin film transistors comprises a second gate electrode; and the orthographic projection of the light shielding layer on the base substrate substantially surrounds, but is substantially non-overlapping with, an orthographic projection of the second gate electrode on the base substrate.

Optionally, the array substrate further comprises a plurality of switching thin film transistors configured to respectively control on/off switching of the plurality of driving thin film transistors, each of the plurality of switching thin film transistors comprising a second active layer; wherein an orthographic projection of the light shielding layer on the base substrate at least partially overlaps with an orthographic projection of the second active layer on the base substrate.

Optionally, the one or more power supply lines comprise a plurality of columns of power supply lines spaced apart from each other; the light shielding layer comprises a plurality of rows of light shielding bars; and the plurality of rows of light shielding bars electrically connect the plurality of columns of power supply lines thereby forming a grid of power supply lines.

Optionally, the plurality of driving thin film transistors are a plurality of bottom-gate thin film transistors.

Optionally, the plurality of driving thin film transistors are a plurality of top-gate thin film transistors.

Optionally, the plurality of light emitting elements are a plurality of organic light emitting diodes.

In another aspect, the present invention provides a display apparatus comprising the array substrate described herein or fabricated by a method described herein.

In another aspect, the present invention provides a method of reducing current-resistance (IR) drop in one or more power supply lines and reducing data loss in a display apparatus, wherein the display apparatus comprises a base substrate; a plurality of light emitting elements on the base substrate; a plurality of driving thin film transistors for driving light emission of the plurality of light emitting elements, each of the plurality of driving thin film transistors comprising a first active layer; and one or more power supply lines configured to supply a driving current respectively to the plurality of light emitting elements; wherein the method comprises forming a light shielding layer electrically connected to at least one of the one or more power supply lines and configured to shield light from irradiating on the first active layer.

In another aspect, the present invention provides a method of fabricating an array substrate, comprising forming a plurality of light emitting elements on a base substrate; forming a plurality of driving thin film transistors for driving light emission of the plurality of light emitting elements, each of the plurality of driving thin film transistors being formed to comprise a first active layer; forming one or more power supply lines configured to supply a driving current respectively to the plurality of light emitting elements; and forming a light shielding layer configured to shield light from irradiating on the first active layer, the light shielding layer being formed to be electrically connected to at least one of the one or more power supply lines.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
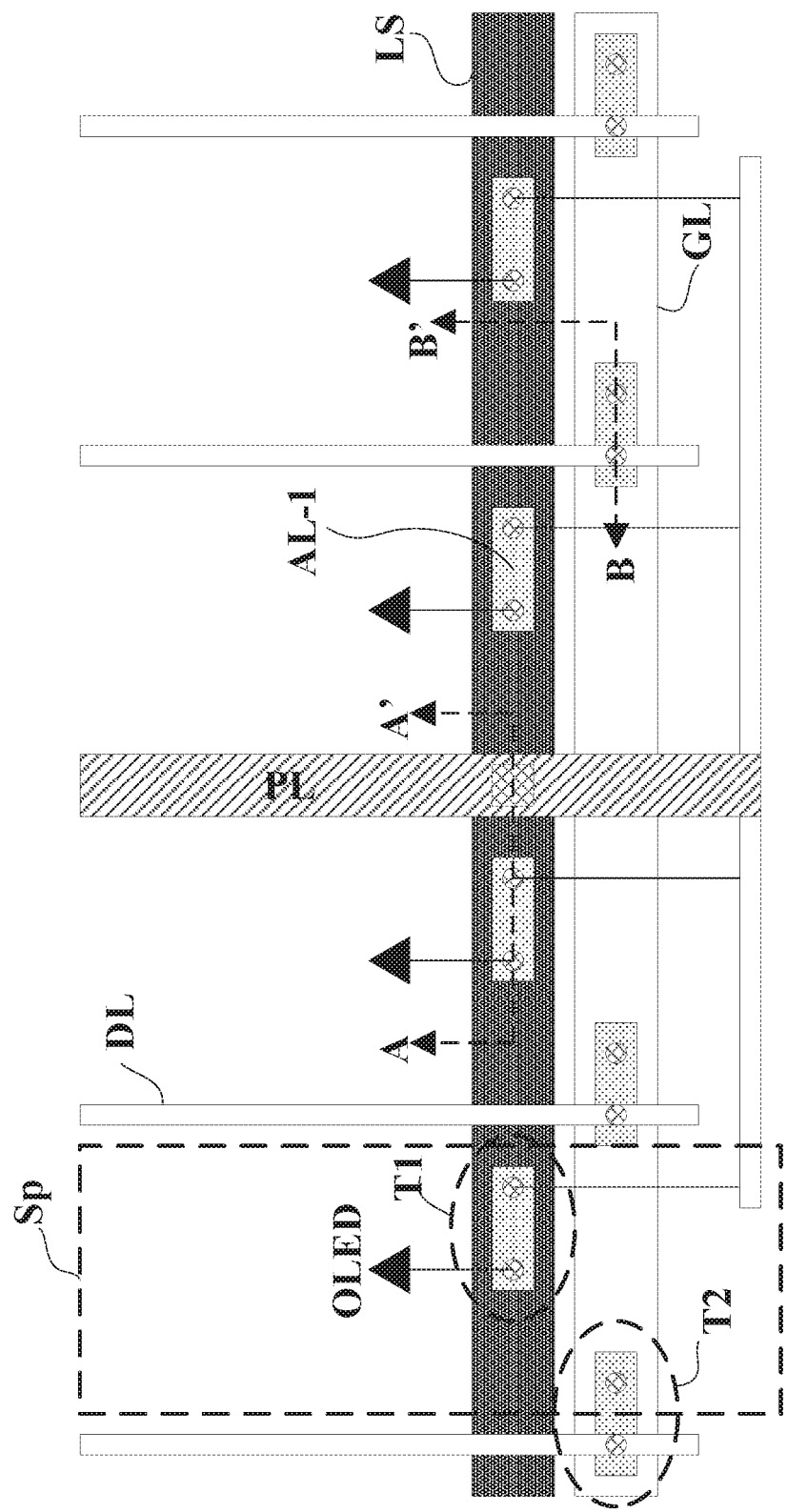
FIG. 1 is a schematic diagram illustrating the structure of an array substrate in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In a display apparatus, the gate electrode is made of a metallic material that is light blocking. Thus, the gate electrode sometimes can function to at least partially shield light from irradiating on the active layer of the thin film transistor. Typically, the gate electrode is designed to have a limited size in order to enhance the display resolution of the display apparatus. Moreover, considering the parasitic capacitance generated by the gate electrode, it is generally undesirable to have a gate electrode that is much larger than the active layer of the thin film transistor. Due to the limited size of the gate electrode, the active layer is typically insufficiently shielded from light (either internal or external light), resulting in deterioration of performance of the thin film transistor. Other issues such as data loss and current-resistance (IR) drop in power supply lines are often found in a typical display apparatus.

Accordingly, the present disclosure provides, inter alia, an array substrate, a display apparatus, a method of reducing current-resistance (IR) drop in one or more power supply lines and reducing data loss in a display apparatus, and a method of fabricating an array substrate that substantially obviate one or more of the problems due to limitations and disadvantages of the related art. In one aspect, the present disclosure provides an array substrate. In some embodiments, the array substrate includes a base substrate; a plurality of light emitting elements on the base substrate; a plurality of driving thin film transistors for driving light emission of the plurality of light emitting elements, each of the plurality of driving thin film transistors including a first active layer; one or more power supply lines configured to supply a driving current respectively to the plurality of light emitting elements; and a light shielding layer configured to shield light from irradiating on the first active layer, the light shielding layer being electrically connected to at least one of the one or more power supply lines. Various appropriate light emitting elements may be used in the present array substrate. Optionally, the light emitting element is an organic light emitting diode. Optionally, the light emitting element is a quantum dots light emitting diode. Optionally, the light emitting element is a micro light emitting diode.

As used herein, the term "power supply line" refers to a signal line having a primary function of transmitting power. Optionally, the power supply line is a signal line electrically connected to a source electrode of a driving thin film transistor and configured to supply a driving current for driving a light emitting diode to emit light, e.g., a VDD line.

Figure 2:
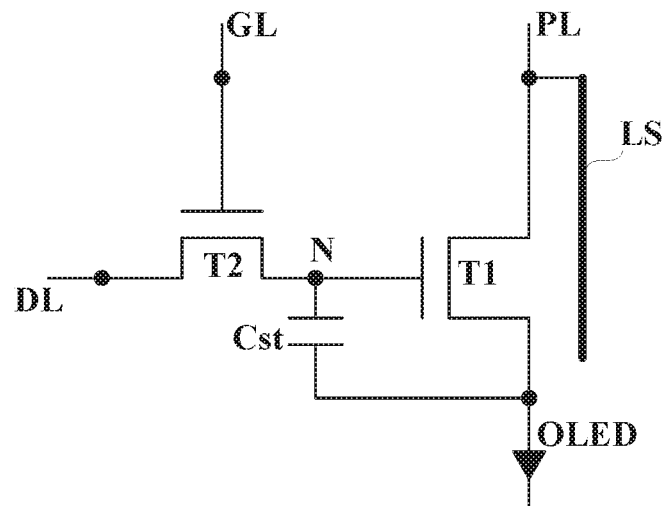
FIG. 2 is a circuit diagram of a pixel driving circuit in an array substrate in some embodiments according to the present disclosure.
Figure 3:
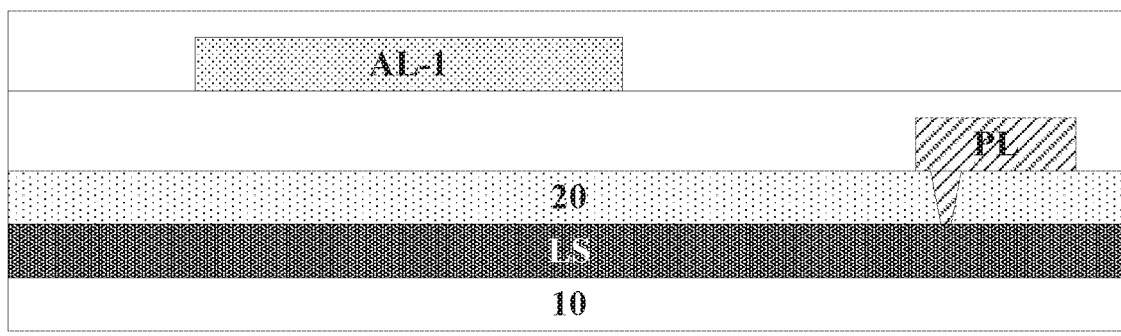
FIG. 3 is a cross-sectional view of an array substrate in some embodiments according to the present disclosure.

FIG. 1 is a schematic diagram illustrating the structure of an array substrate in some embodiments according to the present disclosure. FIG. 2 is a circuit diagram of a pixel driving circuit in an array substrate in some embodiments according to the present disclosure. FIG. 3 is a cross-sectional view of an array substrate in some embodiments according to the present disclosure. Referring to FIGS. 1 to 3, the array substrate in some embodiments includes a base substrate 10, a plurality of light emitting elements (e.g., a plurality of organic light emitting diodes OLED in FIG. 1 and FIG. 2) on the base substrate 10, a plurality of driving thin film transistors T1 for driving light emission of the plurality of light emitting elements; one or more power supply lines PL configured to supply a driving current respectively to the plurality of light emitting elements; and a light shielding layer LS electrically connected to at least one of the one or more power supply lines PL. Optionally, each of the plurality of driving thin film transistors T1 includes a first active layer AL-1. The light shielding layer LS is configured to at least partially shield light from irradiating on the first active layer AL-1. By having a light shielding layer LS, the first active layer AL-1 of the plurality of driving thin film transistors T1 can be substantially shielded from external light or internal light. By having the light shielding layer LS electrically connected to at least one of the one or more power supply lines PL, the resistance of the one or more power supply lines PL can be reduced, thereby reducing the current-resistance (IR) drop in one or more power supply lines. Moreover, by forming additional capacitance between the light shielding layer LS and a gate electrode of the one of the plurality of driving thin film transistors T1, the data loss in the display apparatus can be significantly reduced or eliminated.

Optionally, an orthographic projection of the light shielding layer LS on the base substrate 10 at least partially overlaps with an orthographic projection of the first active layer AL-1 on the base substrate 10. Referring to FIG. 3, optionally, the orthographic projection of the light shielding layer LS on the base substrate 10 substantially covers the orthographic projection of the first active layer AL-1 on the base substrate 10.

FIG. 2 illustrates a 2T1C (two transistors plus one capacitor) circuit diagram of a pixel driving circuit in an array substrate in some embodiments according to the present disclosure. The driving circuit includes one of the plurality of driving thin film transistors T1 and one of a plurality of switching thin film transistors T2 in the array substrate, and a capacitor Cst. In operation, the gate line GL transmit a gate scanning signal to turn on the one of the plurality of switching thin film transistors T2, and the capacitor Cst is then charged by a gray scale voltage (a data signal) transmitted through a data line DL. When the gate line GL is not transmitting the gate scanning signal, the one of the plurality of switching thin film transistors T2 is turned off, and the gray scale voltage is held in the capacitor Cst. The one or more power supply line PL is electrically connected to a source electrode of the one of the plurality of driving thin film transistors T1. The one or more power supply line PL provides a power voltage that is relatively high (e.g., a VDD signal). Because the power voltage is relatively high, the one of the plurality of driving thin film transistors T1 is saturated, and generates a driving current for driving one of the plurality of organic light emitting diodes OLED connected to a drain electrode of the one of the driving thin film transistors T1.

Various other appropriate pixel driving circuits may be used in the present array substrate. Examples of appropriate pixel driving circuits include 3T1C (three transistors plus one capacitor), 4T1C (four transistors plus one capacitor), 4T2C (four transistors plus two capacitors), 5T1C (five transistors plus one capacitor), and variations and modifications thereof.

Figure 4:
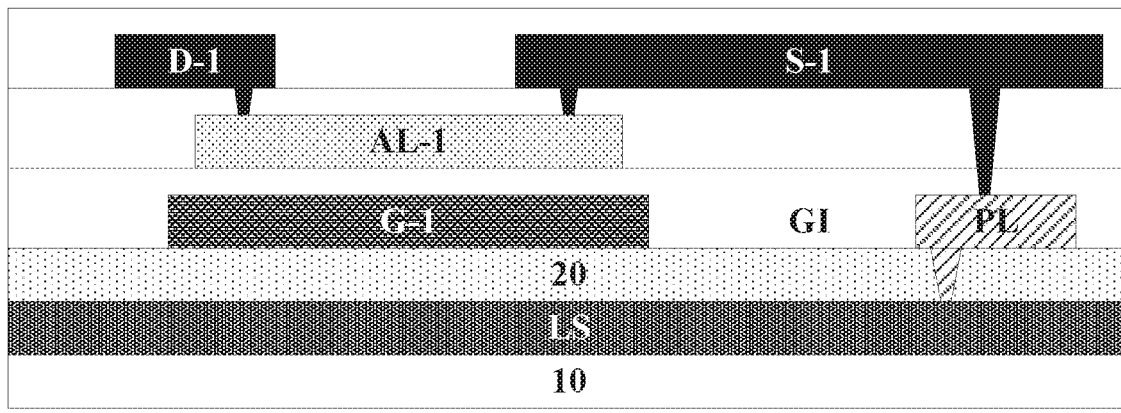
FIG. 4 is a cross-sectional view along A-A' line in the array substrate of FIG. 1.

FIG. 4 is a cross-sectional view along A-A' line in the array substrate of FIG. 1. Referring to FIG. 4, in some embodiments, each of the plurality of driving thin film transistors T1 further includes a first gate electrode G-1 between the first active layer AL-1 and the light shielding layer LS. Because the first gate electrode G-1 is made of a metallic material that can at least partially shield light from irradiating on the first active layer AL-1, the light shielding layer LS in the present array substrate is designed to further shield light from irradiating on the first active layer AL-1. In some embodiments, an orthographic projection of the light shielding layer LS on the base substrate 10 at least partially extends outside an orthographic projection of the first gate electrode G-1 on the base substrate 10. Referring to FIG. 4, in some embodiments, the orthographic projection of the light shielding layer LS on the base substrate 10 substantially covers the orthographic projection of the first gate electrode G-1 on the base substrate 10.

Figure 5:
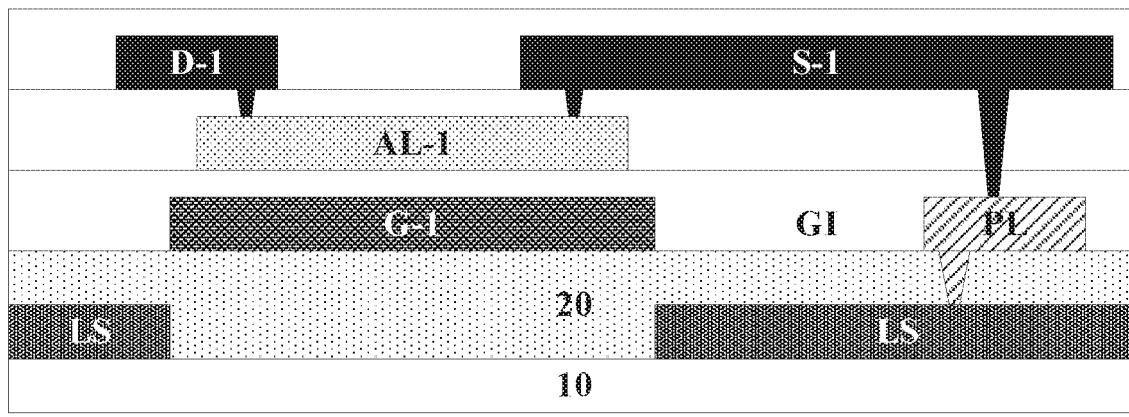
FIG. 5 is a cross-sectional view of an array substrate in some embodiments according to the present disclosure.
Figure 6:
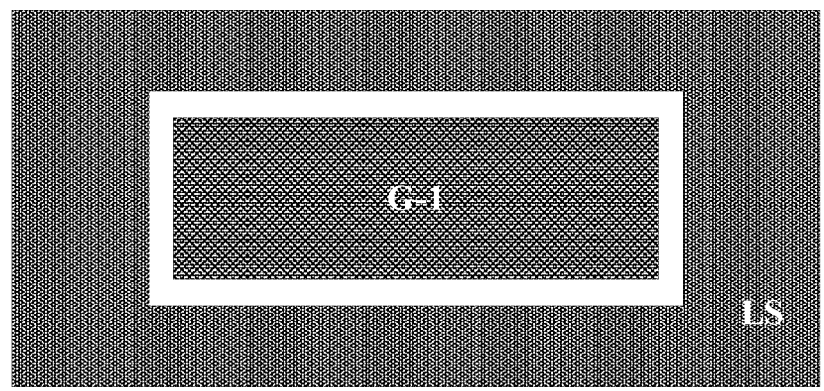
FIG. 6 is a plan view of the first gate electrode and the light shielding layer in the array substrate of FIG. 5.

Because the first gate electrode G-1 already partially shields light from irradiating on the first active layer AL-1, the light shield layer LS needs not cover the area already covered by the first gate electrode G-1. FIG. 5 is a cross-sectional view of an array substrate in some embodiments according to the present disclosure. FIG. 6 is a plan view of the first gate electrode and the light shielding layer in the array substrate of FIG. 5. Referring to FIG. 5 and FIG. 6, in some embodiments, an orthographic projection of the light shielding layer LS on the base substrate 10 substantially surrounds an orthographic projection of the first gate electrode G-1 on the base substrate 10. Optionally, the orthographic projection of the light shielding layer LS on the base substrate 10 is substantially non-overlapping with the orthographic projection of the first gate electrode G-1 on the base substrate 10. Optionally, the orthographic projection of the light shielding layer LS on the base substrate 10 partially overlaps with the orthographic projection of the first gate electrode G-1 on the base substrate 10, e.g., at a peripheral region of the orthographic projection of the first gate electrode G-1 on the base substrate 10.

Similarly, in some embodiments, the orthographic projection of the light shielding layer LS on the base substrate 10 substantially surrounds an orthographic projection of the first active layer AL-1 on the base substrate 10. Optionally, the orthographic projection of the light shielding layer LS on the base substrate 10 is substantially non-overlapping with the orthographic projection of the first active layer AL-1 on the base substrate 10. Optionally, the orthographic projection of the light shielding layer LS on the base substrate 10 partially overlaps with the orthographic projection of the first active layer AL-1 on the base substrate 10.

In some embodiments, as discussed above, the orthographic projection of the light shielding layer LS on the base substrate 10 substantially covers the orthographic projection of the first gate electrode G-1 on the base substrate 10, even though the first gate electrode G-1 already partially shields light from irradiating on the first active layer AL-1. By having the orthographic projection of the light shielding layer LS on the base substrate 10 substantially covers the orthographic projection of the first gate electrode G-1 on the base substrate 10, data loss in the array substrate or a display apparatus having the array substrate can be substantially reduced.

Referring to FIG. 2, after the capacitor Cst is charged by the data signal transmitted through a data line DL, the one of the plurality of switching thin film transistors T2 is turned off. During the process of turning off the one of the plurality of switching thin film transistors T2 (e.g., a voltage level decreases from a high level to a low level), the data signal voltage at the N node (e.g., the data voltage held by the capacitor Cst) in FIG. 2 also decreases by the operation of capacitance coupling. The change in the data signal voltage at the N node, $\Delta V_p$, can be determined according to Equation (1):

$$\Delta V_p = \frac{C_{gs\_s}}{C_{st} + C_{gs\_d} + C_{gd\_d} + C_{\_add\_gd} + C_{\_add\_gs} + C_{gs\_s}} \times (V_{GH} - V_{GL}); \qquad (1)$$

wherein $C_{st}$ stands for a storage capacitance, $C_{gs\_s}$ stands for a gate-source capacitance at the one of the plurality of switching thin film transistors T2, $C_{gs\_d}$ stands for a gate-source capacitance at the one of the plurality of driving thin film transistors T1, $C_{gd\_d}$ stands for a gate-drain capacitance at the one of the plurality of driving thin film transistors T1, $C_{\_add\_gs}$ stands for additional gate-source capacitance at the one of the plurality of driving thin film transistors T1 introduced by the light shielding layer LS, $C_{\_add\_gd}$ stands for additional gate-drain capacitance at the one of the plurality of driving thin film transistors T1 introduced by the light shielding layer LS, $V_{GH}$ stands for a turn-on voltage at the gate electrode of the one of the plurality of switching thin film transistors T2, and $V_{GL}$ stands for a turn-off voltage at the gate electrode of the one of the plurality of switching thin film transistors T2.

In some embodiments, a pixel driving circuit (e.g., a 2T1C circuit) does not include a light shielding layer electrically connected to a power supply line. In the pixel driving circuit not having a light shielding layer, the change in the data signal voltage at the N node, $\Delta V_p$, can be determined according to Equation (2):

$$\Delta V_p = \frac{C_{gs\_s}}{C_{st} + C_{gs\_d} + C_{gd\_d} + C_{gs\_s}}(V_{GH} - V_{GL}); \quad (2)$$

wherein $C_{st}$ stands for a storage capacitance, $C_{gs\_s}$ stands for a gate-source capacitance at the one of the plurality of switching thin film transistors T2, $C_{gs\_d}$ stands for a gate-source capacitance at the one of the plurality of driving thin film transistors T1, $C_{gd\_d}$ stands for a gate-drain capacitance at the one of the plurality of driving thin film transistors T1, $V_{GH}$ stands for a turn-on voltage at the gate electrode of the one of the plurality of switching thin film transistors T2, and $V_{GL}$ stands for a turn-off voltage at the gate electrode of the one of the plurality of switching thin film transistors T2.

Comparing Equation (1) with Equation (2), by having a light shielding layer LS, the decrease in the data signal voltage at the N node (data loss) is significantly reduced. By having the orthographic projection of the light shielding layer LS on the base substrate 10 substantially covers the orthographic projection of the first gate electrode G-1 on the base substrate 10, the $C_{\_add\_gs}$ and $C_{\_add\_gd}$ can be maximized, and the data loss can be further reduced.

Optionally, referring to FIG. 4 and FIG. 5, the first gate electrode G-1 and the one or more power supply lines PL are in a same layer, made of a same material, and formed in a single patterning process (e.g., using a single mask plate). As used herein, the term "same layer" refers to the relationship between the layers simultaneously formed in the same step. In one example, the first gate electrode G-1 and the one or more power supply lines PL are in a same layer when they are formed as a result of one or more steps of a same patterning process performed in a same layer of material. In another example, the first gate electrode G-1 and the one or more power supply lines PL can be formed in a same layer by simultaneously performing the step of forming the first gate electrode G-1 and the step of forming the one or more power supply lines PL. The term "same layer" does not always mean that the thickness of the layer or the height of the layer in a cross-sectional view is the same.

Referring to FIG. 2, FIG. 4, and FIG. 5, the light shielding layer LS is directly electrically connected to one of the one or more power supply lines PL through a via in the array substrate. Referring to FIG. 4 and FIG. 5, the array substrate includes a base substrate 10, a light shielding layer LS on the base substrate 10, a buffer layer 20 on the light shielding layer LS, a first gate electrode G-1 and one or more power supply lines PL on a side of the buffer layer 20 distal to the light shielding layer LS, a gate insulating layer GI on a side of the first gate electrode G-1 and the one or more power supply lines PL distal to the buffer layer 20, a first active layer AL-1 on a side of the gate insulating layer GI distal to the base substrate 10, and a first source electrode S-1 and a first drain electrode D-1 on a side of the first active layer AL-1 distal to the base substrate 10. In some embodiments, the light shielding layer LS is directly electrically connected to one of the one or more power supply lines PL through a via extending through the buffer layer 20.

Figure 7:
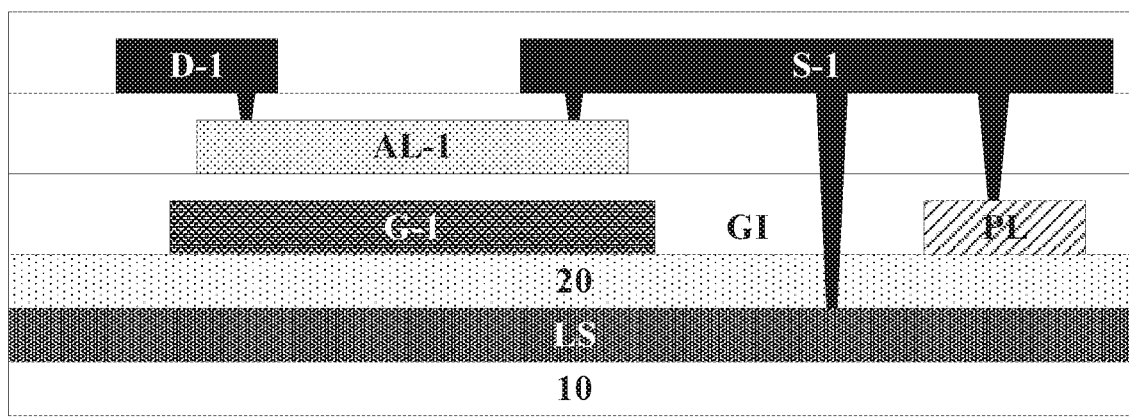
FIG. 7 is a cross-sectional view of an array substrate in some embodiments according to the present disclosure.

In the present array substrate, each of the plurality of driving thin film transistors T1 includes a source electrode S-1 electrically connected to one of the one or more power supply lines PL. Accordingly, in some embodiments, the light shielding layer LS is electrically connected to the at least one of the one or more power supply lines PL through the first source electrode S-1. FIG. 7 is a cross-sectional view of an array substrate in some embodiments according to the present disclosure. Referring to FIG. 7, the light shielding layer LS is electrically connected to the first source electrode S-1 through a via extending through at least the gate insulating layer GI and the buffer layer 20 in the array substrate, and the first source electrode S-1 is electrically connected the one or more power supply lines PL through a via extending through at least the gate insulating layer GI. Because the light shielding layer LS and the one or more power supply lines PL are commonly connected to the first source electrode S-1, the light shielding layer LS is electrically connected to the at least one of the one or more power supply lines PL through the first source electrode S-1.

Figure 8:
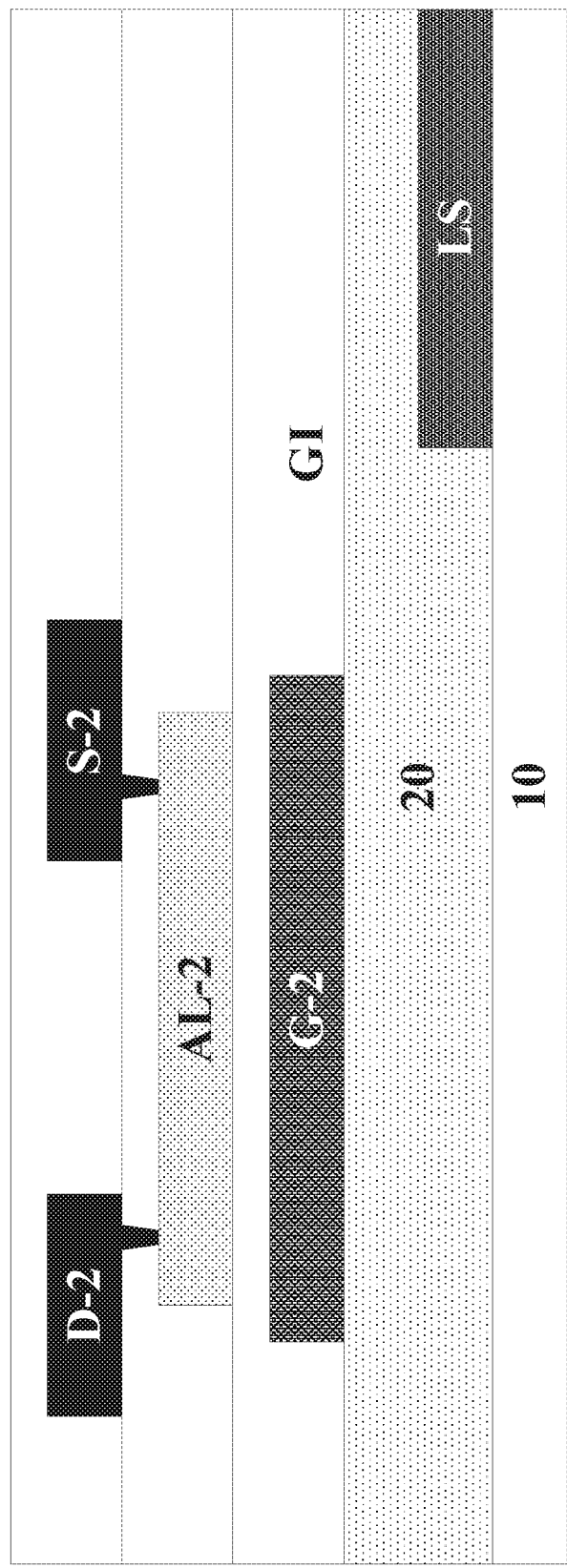
FIG. 8 is a cross-sectional view along B-B' line in the array substrate of FIG. 1.

Referring to FIG. 1, in some embodiments, the array substrate further includes a plurality of switching thin film transistors T2 configured to respectively control on/off switching of the plurality of driving thin film transistors T1. Each of the plurality of switching thin film transistors includes a second active layer. FIG. 8 is a cross-sectional view along B-B' line in the array substrate of FIG. 1. As shown in FIG. 1 and FIG. 8, each of the plurality of switching thin film transistors T2 includes a second gate electrode G-2, a second active layer AL-2, a second source electrode S-2, and a second drain electrode D-2. The orthographic projection of the light shielding layer LS on the base substrate 10 is substantially non-overlapping with an orthographic projection of the plurality of switching thin film transistors T2 on the base substrate 10. Optionally, the orthographic projection of the light shielding layer LS on the base substrate 10 is substantially non-overlapping with an orthographic projection of the second active layer AL-2 on the base substrate 10. Optionally, the orthographic projection of the light shielding layer LS on the base substrate 10 is substantially non-overlapping with an orthographic projection of the second gate electrode G-2 on the base substrate 10.

According to the Equation (1) discussed above, by having the orthographic projection of the light shielding layer LS on the base substrate 10 is substantially non-overlapping with the orthographic projection of the plurality of switching thin film transistors T2 on the base substrate 10, the numerator part of the Equation (1) will not be increased. Thus, the data loss can be reduced due to the additional capacitance formed between the light shielding layer LS and the gate electrode of the one of the plurality of driving thin film transistors TL.

Figure 9:
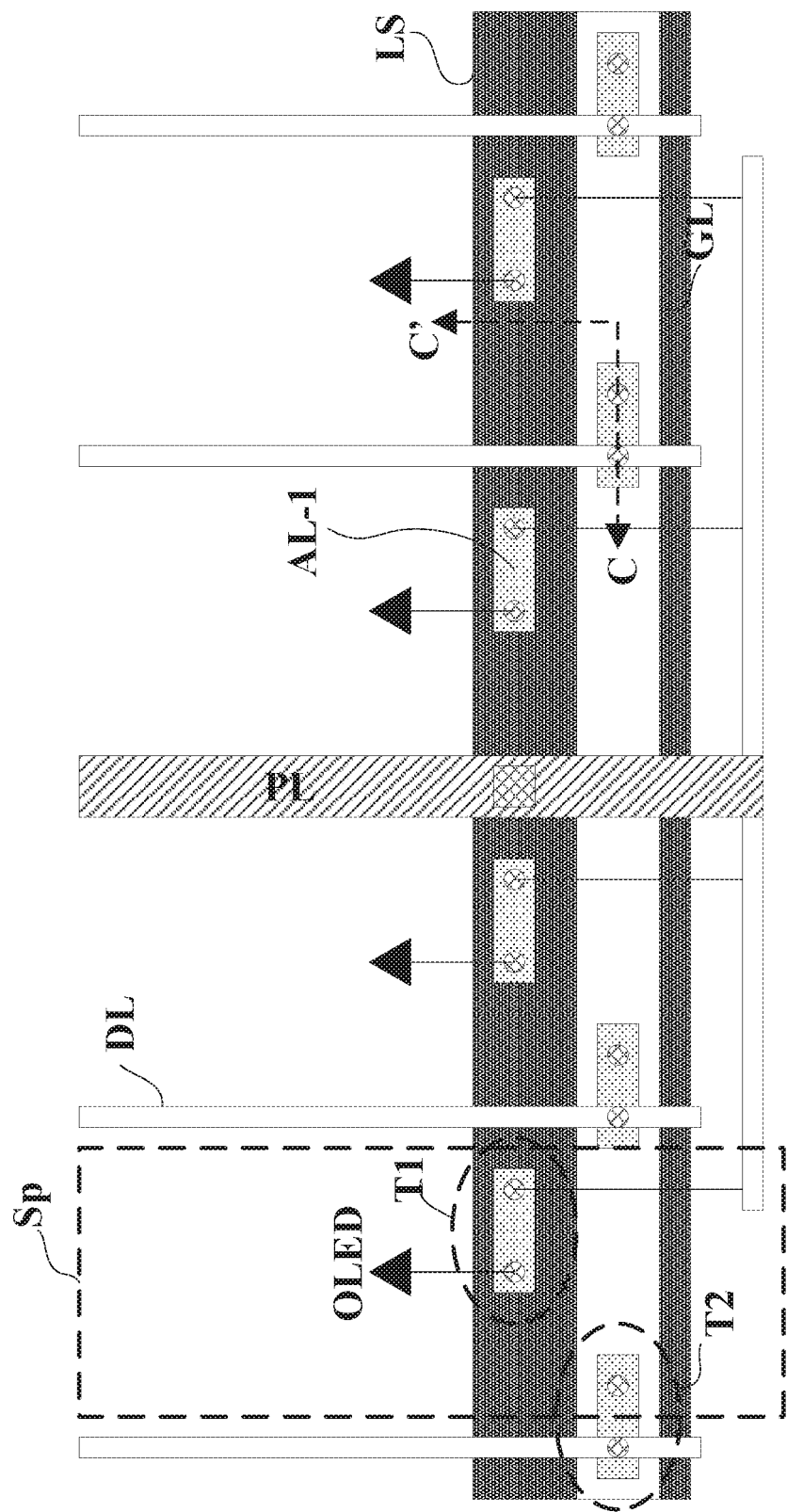
FIG. 9 is a schematic diagram illustrating the structure of an array substrate in some embodiments according to the present disclosure.
Figure 10:
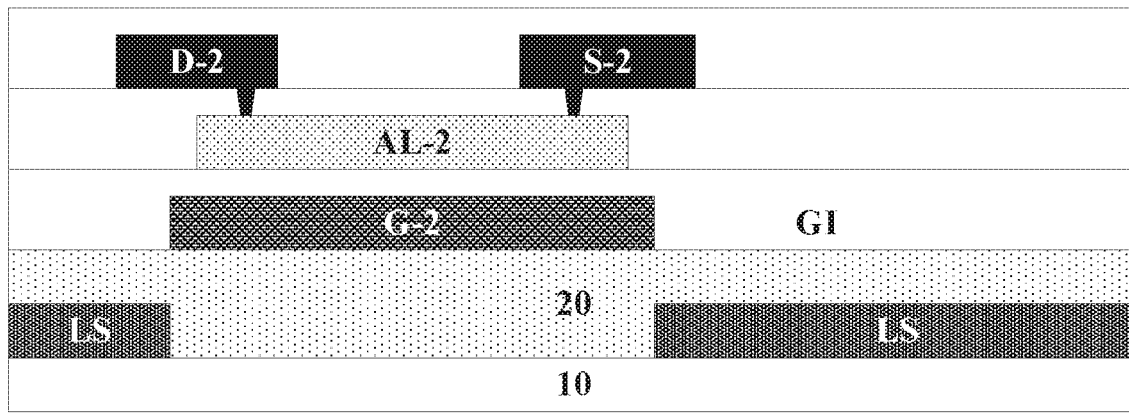
FIG. 10 is a cross-sectional view along C-C' line in the array substrate of FIG. 9.
Figure 11:
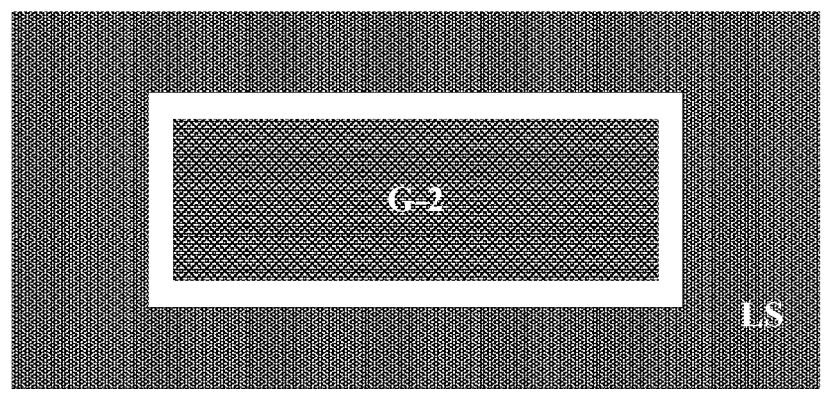
FIG. 11 is a plan view of the second gate electrode and the light shielding layer in the array substrate of FIG. 10.

FIG. 9 is a schematic diagram illustrating the structure of an array substrate in some embodiments according to the present disclosure. FIG. 10 is a cross-sectional view along C-C' line in the array substrate of FIG. 9. FIG. 11 is a plan view of the second gate electrode and the light shielding layer in the array substrate of FIG. 10. Referring to FIGS. 9 to 11, in some embodiments, the orthographic projection of the light shielding layer LS on the base substrate 10 substantially surrounds an orthographic projection of the second gate electrode G-2 on the base substrate 10. Optionally, the orthographic projection of the light shielding layer LS on the base substrate 10 is substantially non-overlapping with the orthographic projection of the second gate electrode G-2 on the base substrate 10 (as shown in FIG. 11). Optionally, the orthographic projection of the light shielding layer LS on the base substrate 10 partially overlaps with the orthographic projection of the second gate electrode G-2 on the base substrate 10, e.g., at a peripheral region of the orthographic projection of the second gate electrode G-2 on the base substrate 10. By having this design, the light shielding layer LS and the second gate electrode G-2 of the one of the plurality of switching thin film transistors T2 does not form any additional capacitance or only form a minimal additional capacitance. The numerator part of the Equation (1) does not increase or only increases minimally. Accordingly, the data loss can still be reduced due to the additional capacitance formed between the light shielding layer LS and the gate electrode of the one of the plurality of driving thin film transistors T1 (added to the denominator part of the Equation (1)), while the light shielding layer LS further shield light from irradiating on the second active layer AL-2 of the plurality of switching thin film transistors T2 (e.g., the light shielding layer LS and the second gate electrode G-2 together shield light from irradiating on the second active layer AL-2).

Figure 12:
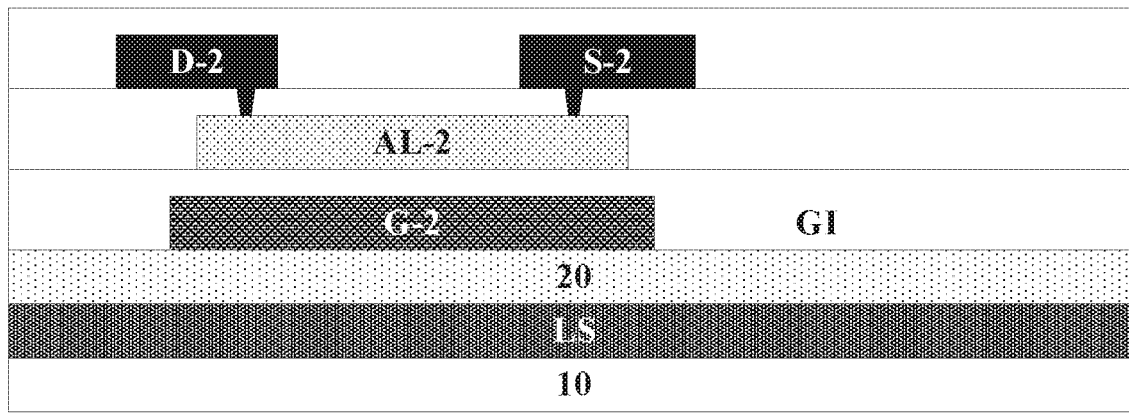
FIG. 12 is a cross-sectional view of an array substrate in some embodiments according to the present disclosure.

In some embodiments, the orthographic projection of the light shielding layer LS on the base substrate 10 at least partially overlaps with an orthographic projection of the second active layer AL-2 on the base substrate 10. FIG. 12 is a cross-sectional view of an array substrate in some embodiments according to the present disclosure. Referring to FIG. 12, in some embodiments, the orthographic projection of the light shielding layer LS on the base substrate 10 substantially covers the orthographic projection of the second active layer AL-2 on the base substrate 10.

Figure 13:
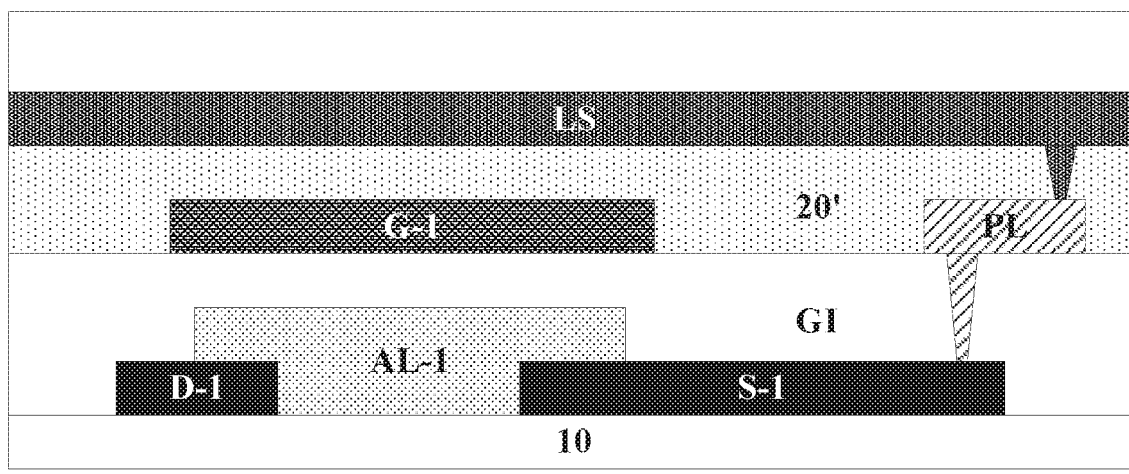
FIG. 13 is a cross-sectional view of an array substrate in some embodiments according to the present disclosure.

In some embodiments, the plurality of driving thin film transistors T1 and the plurality of switching thin film transistors T2 are a plurality of bottom-gate thin film transistors (see, e.g., FIGS. 4, 5, 7, 8, 10, and 12). In some embodiments, the plurality of driving thin film transistors T1 are a plurality of top-gate thin film transistors. FIG. 13 is a cross-sectional view of an array substrate in some embodiments according to the present disclosure. Referring to FIG. 13, the array substrate in some embodiments includes a base substrate 10, a first source electrode S-1 and a first drain electrode D-1 on the base substrate 10, a first active layer AL-1 on a side of the first source electrode S-1 and the first drain electrode D-1 distal to the base substrate 10, a gate insulating layer GI on a side of the first active layer AL-1 distal to the base substrate 10, a first gate electrode G-1 and one or more power supply lines PL on a side of the gate insulating layer GI distal to the base substrate 10, an insulating layer 20' on a side of the first gate electrode G-1 and the one or more power supply lines PL distal to the gate insulating layer GI, and a light shielding layer LS on a side of the insulating layer 20' distal to the base substrate 10. The light shielding layer LS is electrically connected to the one or more power supply lines PL through a via extending through the insulating layer 20', and the first source electrode S-1 is electrically connected to the one or more power supply lines PL through a via extending through the gate insulating layer GI.

In some embodiments, the plurality of switching thin film transistors T2 are a plurality of bottom-gate thin film transistors.

Optionally, the first active layer AL-1 includes a metal oxide material (e.g., indium tin oxide). Optionally, the first active layer AL-1 includes a metal oxynitride material. Optionally, the second active layer AL-2 includes a metal oxide material (e.g., indium tin oxide). Optionally, the second active layer AL-2 includes a metal oxynitride material.

The one or more power lines can be arranged in various appropriate manners in the present array substrate. In some embodiments, the one or more power lines includes a plurality of columns of power supply lines spaced apart from each other, and a power voltage (e.g., a VDD voltage) is separately provided to each of the plurality of columns of power supply lines. In some embodiments, the one or more power lines are arranged as a grid of interconnected power supply lines, and a power voltage (e.g., a VDD voltage) is separately provided to the grid.

Figure 14:
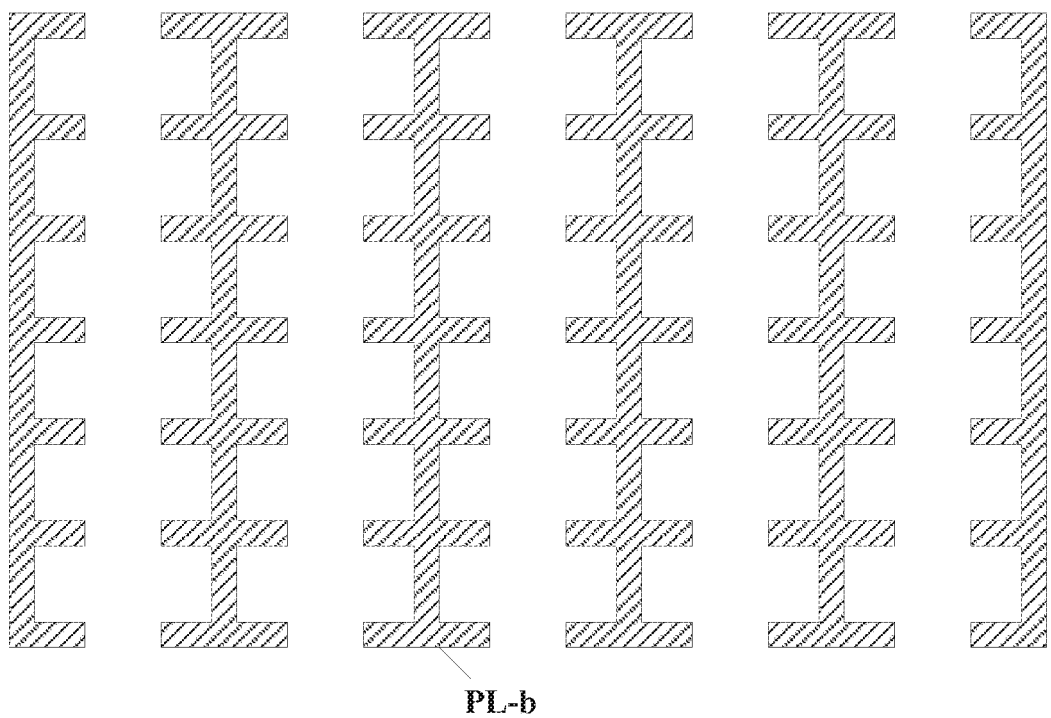
FIG. 14 is a structure of a plurality of columns of power supply lines in an array substrate in some embodiments according to the present disclosure.

FIG. 14 is a structure of a plurality of columns of power supply lines in an array substrate in some embodiments according to the present disclosure. Referring to FIG. 14, the one or more power supply lines includes a plurality of columns of power supply lines PL-b spaced apart from each other. The plurality of columns of power supply lines PL-b are substantially parallel to each other. In some embodiments, adjacent columns of power supply lines of the plurality of columns of power supply lines PL-b are not electrically connected to each other by the light shielding layer, and remains spaced apart from each other. In some embodiments, the presence of the light shielding layer electrically connects the plurality of columns of power supply lines PL-b to each other.

Figure 15:
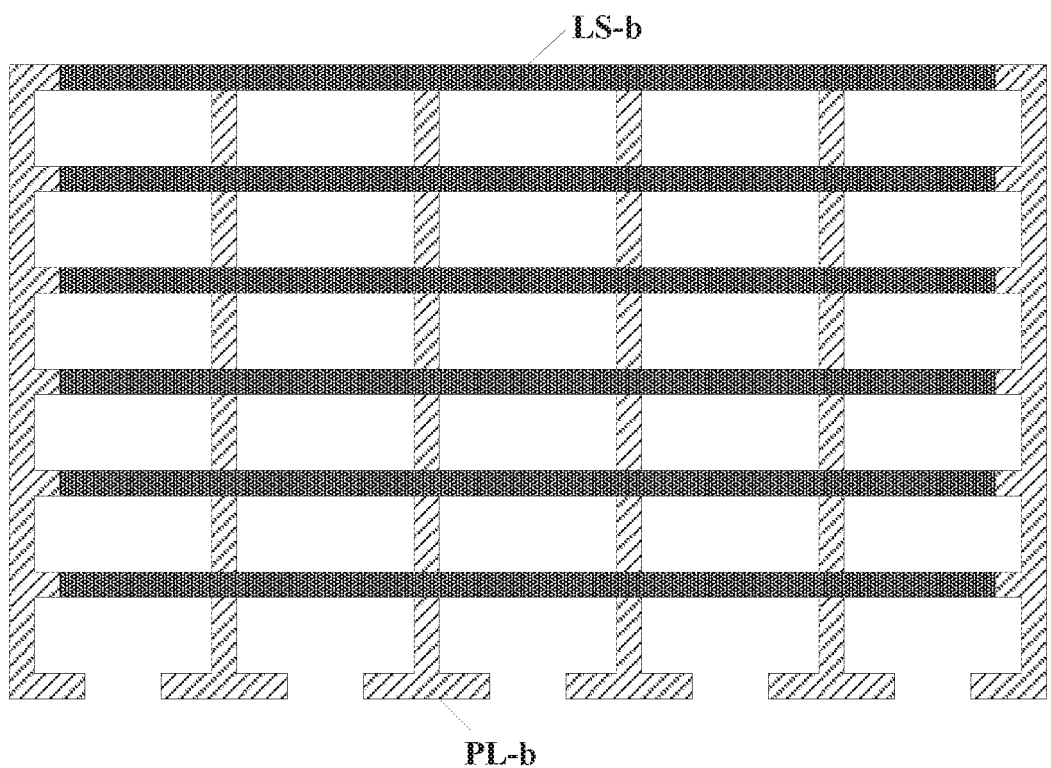
FIG. 15 illustrates electrical connection of a plurality of columns of power supply lines by a plurality of rows of light shielding bars in an array substrate in some embodiments according to the present disclosure.

FIG. 15 illustrates electrical connection of a plurality of columns of power supply lines by a plurality of rows of light shielding bars in an array substrate in some embodiments according to the present disclosure. Referring to FIG. 15, the array substrate includes a plurality of columns of power supply lines PL-b spaced apart from each other, and the light shielding layer includes a plurality of rows of light shielding bars LS-b spacing apart from each other. The plurality of rows of light shielding bars LS-b are substantially parallel to each other. As shown in FIG. 15, the plurality of rows of light shielding bars LS-b electrically connect the plurality of columns of power supply lines PL-b thereby forming a grid of power supply lines.

In another aspect, the present disclosure provides a method of reducing current-resistance (IR) drop in one or more power supply lines. In some embodiments, the method includes forming a light shielding layer electrically connected to at least one of the one or more power supply lines. By having a light shielding layer electrically connected to at least one of the one or more power supply lines, the resistance of the one or more power supply lines PL can be reduced, thereby reducing the current-resistance (IR) drop in one or more power supply lines.

In another aspect, the present disclosure provides a method of reducing data loss in a display apparatus. In some embodiments, the method includes forming a light shielding layer electrically connected to at least one of the one or more power supply lines and configured to shield light from irradiating on the first active layer. Optionally, the method includes forming capacitance between the light shielding layer and a gate electrode of the one of the plurality of driving thin film transistors, thereby reducing data loss in the display apparatus. Optionally, the step of forming the light shielding layer includes forming a light shielding layer, an orthographic projection of which on the base substrate at least partially overlaps with an orthographic projection of the first gate electrode of the plurality of driving thin film transistors on the base substrate, thereby forming the capacitance between the light shielding layer and the first gate electrode. Optionally, the step of forming the light shielding layer includes forming a light shielding layer, an orthographic projection of which on the base substrate substantially covers an orthographic projection of the first gate electrode of the plurality of driving thin film transistors on the base substrate, thereby maximizing the capacitance between the light shielding layer and the first gate electrode.

In another aspect, the present disclosure provides a method of fabricating an array substrate. In some embodiments, the method includes forming a plurality of light emitting elements on a base substrate; forming a plurality of driving thin film transistors for driving light emission of the plurality of light emitting elements, each of the plurality of driving thin film transistors being formed to include a first active layer; forming one or more power supply lines configured to supply a driving current respectively to the plurality of light emitting elements; and forming a light shielding layer configured to shield light from irradiating on the first active layer, the light shielding layer being formed to be electrically connected to at least one of the one or more power supply lines. Optionally, the light shielding layer is formed so that an orthographic projection of the light shielding layer on the base substrate at least partially overlaps with an orthographic projection of the first active layer on the base substrate. Optionally, the light shielding layer is formed so that an orthographic projection of the light shielding layer on the base substrate substantially covers an orthographic projection of the first active layer on the base substrate.

In some embodiments, the step of forming the plurality of driving thin film transistors includes forming a first gate electrode in each of the plurality of driving thin film transistors. Optionally, the first gate electrode is formed between the first active layer and the light shielding layer. Optionally, the light shielding layer is formed so that an orthographic projection of the light shielding layer on the base substrate at least partially extends outside an orthographic projection of the first gate electrode on the base substrate. Optionally, the light shielding layer is formed so that the orthographic projection of the light shielding layer on the base substrate substantially covers the orthographic projection of the first gate electrode on the base substrate. Optionally, the light shielding layer is formed so that an orthographic projection of the light shielding layer on the base substrate substantially surrounds, but is substantially non-overlapping with, an orthographic projection of the first gate electrode on the base substrate. Optionally, the first gate electrode and the one or more power supply lines are formed in a same layer and using a same material, e.g., formed using a single mask plate in a single patterning process.

In some embodiments, the step of forming the plurality of driving thin film transistors includes forming a source electrode in each of the plurality of driving thin film transistors. Optionally, the source electrode is formed to be electrically connected to one of the one or more power supply lines. Optionally, the light shielding layer is electrically connected to the at least one of the one or more power supply lines through the source electrode.

In some embodiments, the method further includes forming a plurality of switching thin film transistors configured to respectively control on/off switching of the plurality of driving thin film transistors. Each of the plurality of switching thin film transistors is formed to include a second active layer. Optionally, the light shielding layer is formed so that an orthographic projection of the light shielding layer on the base substrate is substantially non-overlapping with an orthographic projection of the second active layer on the base substrate. Optionally, the step of forming the plurality of switching thin film transistors includes forming a second gate electrode in each of the plurality of switching thin film transistors. Optionally, the light shielding layer is formed so that the orthographic projection of the light shielding layer on the base substrate substantially surrounds, but is substantially non-overlapping with, an orthographic projection of the second gate electrode on the base substrate. Optionally, the light shielding layer is formed so that an orthographic projection of the light shielding layer on the base substrate at least partially overlaps with an orthographic projection of the second active layer on the base substrate.

In another aspect, the present disclosure provides a display apparatus having an array substrate described herein or fabricated by a method described herein. Examples of appropriate display apparatuses include, but are not limited to, an electronic paper, a mobile phone, a tablet computer, a television, a monitor, a notebook computer, a digital album, a GPS, etc. In one example, the display apparatus is a smart watch. Optionally, the display apparatus is an organic light emitting diode display apparatus.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first". "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising:
a base substrate;
a plurality of light emitting elements on the base substrate;
a plurality of driving thin film transistors for driving light emission of the plurality of light emitting elements, each of the plurality of driving thin film transistors comprising a first active layer;
a plurality of switching thin film transistors configured to respectively control on/off switching of the plurality of driving thin film transistors, each of the plurality of switching thin film transistors comprising a second active layer;
one or more power supply lines configured to supply a driving current respectively to the plurality of light emitting elements; and
a light shielding layer configured to shield light from irradiating on the first active layer, the light shielding layer being electrically connected to at least one of the one or more power supply lines;
wherein an orthographic projection of the light shielding layer on the base substrate is substantially non-overlapping with an orthographic projection of the second active layer on the base substrate.

2. The array substrate of claim 1, wherein an orthographic projection of the light shielding layer on the base substrate at least partially overlaps with an orthographic projection of the first active layer on the base substrate.

3. The array substrate of claim 2, wherein the orthographic projection of the light shielding layer on the base substrate substantially covers the orthographic projection of the first active layer on the base substrate.

4. The array substrate of claim 1, wherein each of the plurality of driving thin film transistors further comprises a first gate electrode between the first active layer and the light shielding layer.

5. The array substrate of claim 4, wherein an orthographic projection of the light shielding layer on the base substrate at least partially extends outside an orthographic projection of the first gate electrode on the base substrate.

6. The array substrate of claim 4, wherein an orthographic projection of the light shielding layer on the base substrate substantially covers an orthographic projection of the first gate electrode on the base substrate.

7. The array substrate of claim 4, wherein an orthographic projection of the light shielding layer on the base substrate substantially surrounds, but is substantially non-overlapping with, an orthographic projection of the first gate electrode on the base substrate.

8. The array substrate of claim 4, wherein the first gate electrode and the one or more power supply lines are in a same layer and comprise a same material.

9. The array substrate of claim 1, wherein each of the plurality of driving thin film transistors comprises a source electrode electrically connected to one of the one or more power supply lines.

10. The array substrate of claim 9, wherein the light shielding layer is electrically connected to the at least one of the one or more power supply lines through the source electrode.

11. The array substrate of claim 1, wherein each of the plurality of switching thin film transistors comprises a second gate electrode; and
the orthographic projection of the light shielding layer on the base substrate substantially surrounds, but is substantially non-overlapping with, an orthographic projection of the second gate electrode on the base substrate.

12. An array substrate, comprising:
a base substrate;
a plurality of light emitting elements on the base substrate;
a plurality of driving thin film transistors for driving light emission of the plurality of light emitting elements, each of the plurality of driving thin film transistors comprising a first active layer;
a plurality of switching thin film transistors configured to respectively control on/off switching of the plurality of driving thin film transistors, each of the plurality of switching thin film transistors comprising a second active layer;
one or more power supply lines configured to supply a driving current respectively to the plurality of light emitting elements; and
a light shielding layer configured to shield light from irradiating on the first active layer, the light shielding layer being electrically connected to at least one of the one or more power supply lines;
wherein an orthographic projection of the light shielding layer on the base substrate at least partially overlaps with an orthographic projection of the second active layer on the base substrate.

13. The array substrate of claim 1, wherein the one or more power supply lines comprise a plurality of columns of power supply lines spaced apart from each other;
the light shielding layer comprises a plurality of rows of light shielding bars; and
the plurality of rows of light shielding bars electrically connect the plurality of columns of power supply lines thereby forming a grid of power supply lines.

14. The array substrate of claim 1, wherein the plurality of driving thin film transistors are a plurality of bottom-gate thin film transistors.

15. The array substrate of claim 1, wherein the plurality of driving thin film transistors are a plurality of top-gate thin film transistors.

16. The array substrate of claim 1, wherein the plurality of light emitting elements are a plurality of organic light emitting diodes.

17. A display apparatus, comprising the array substrate of claim 1.

18. A method of reducing current-resistance (IR) drop in one or more power supply lines and reducing data loss in a display apparatus, wherein the display apparatus comprises:
a base substrate;
a plurality of light emitting elements on the base substrate;
a plurality of driving thin film transistors for driving light emission of the plurality of light emitting elements, each of the plurality of driving thin film transistors comprising a first active layer;
a plurality of switching thin film transistors configured to respectively control on/off switching of the plurality of driving thin film transistors, each of the plurality of switching thin film transistors comprising a second active layer; and
one or more power supply lines configured to supply a driving current respectively to the plurality of light emitting elements;

wherein an orthographic projection of the light shielding layer on the base substrate is substantially non-overlapping with an orthographic projection of the second active layer on the base substrate;

wherein the method comprises forming a light shielding layer electrically connected to at least one of the one or more power supply lines and configured to shield light from irradiating on the first active layer.

* * * * *